United States Patent [19]

Kushida et al.

[11] Patent Number: 4,752,818

[45] Date of Patent: Jun. 21, 1988

[54] SEMICONDUCTOR DEVICE WITH MULTIPLE RECOMBINATION CENTER LAYERS

[75] Inventors: Tomoyoshi Kushida, Aichi; Hiroshi Tadano, Nagoya; Yoshio Nakamura, Atsugi, all of Japan

[73] Assignee: Kabushiki Kaisha Toyota Chuo Kenkyusho, Tokyo, Japan

[21] Appl. No.: 912,578

[22] Filed: Sep. 26, 1986

[30] Foreign Application Priority Data

Sep. 28, 1985 [JP] Japan ............................... 60-215397
Apr. 7, 1986 [JP] Japan ............................... 61-079419

[51] Int. Cl.$^4$ .............................................. H01L 29/74
[52] U.S. Cl. ........................................ 357/38; 357/22; 357/64; 357/86
[58] Field of Search ............... 357/234, 23.14, 22 E, 357/22 D, 38, 64, 86

[56] References Cited

U.S. PATENT DOCUMENTS 4,056,408  11/1977  Bartko et al. .
4,223,328  9/1980   Terasawa et al. .................. 357/64
4,259,683  3/1981   Adler et al. ....................... 357/38
4,281,336  7/1981   Sommer et al. .................... 357/38
4,620,211  10/1986  Baliga et al. ..................... 357/23.4
4,656,493  4/1987   Adler et al. ....................... 357/64

Primary Examiner—Joseph E. Clawson, Jr.

[57] ABSTRACT

A semiconductor device comprises two main electrode regions, i.e., cathode and anode regions consisting of high impurity concentration regions of opposite conductivity types, a low impurity concentration region locally formed between the two main electrode regions, a gate region, formed near the cathode region, for controlling a main current, a first local region which has a relatively low carrier lifetime and is formed in a region of the low impurity concentration region near at least one of the gate and cathode regions, and a second local region which has a relatively low carrier lifetime and is formed in a region of the low impurity concentration region which is depleted at the end of the main current turn-off process or which is not depleted to the end, thus satisfying three conditions, i.e., high-speed switching, low forward voltage drop, and high blocking voltage between the main electrodes at the same time.

11 Claims, 6 Drawing Sheets

SEMICONDUCTOR DEVICE WITH MULTIPLE RECOMBINATION CENTER LAYERS

BACKGROUND OF THE INVENTION

1. Field of the Invention

The present invention relates to an improvement of a high-power semiconductor device, such as a static induction thyristor, a gate turn-off thyristor, and the like and, more particularly, to a switching semiconductor device which is capable of high-speed switching of a large current and has a low forward voltage drop and a high blocking voltage between main electrodes.

2. Description of the Prior Art

In control of motors or application of switching power sources by a pulse-width modulation method, if a switching speed is low, a switching loss increases as a control frequency increases, and a heat dissipation arrangement for a device is complex, resulting in a bulky system. If the control frequency is decreased below an audible frequency (20 kHz or lower), a noise generated by the device makes an operator uncomfortable. If acoustic insulation is made in order to prevent this, this also results in a bulky system.

For inductance equipment, e.g., a transformer, it is known that its weight is inversely proportional to $\frac{1}{2}$ square of a frequency. From this point of view, a decrease in control frequency results in a bulky system.

Therefore, in control of motors or application in switching power source by the pulse-width modulation method, a control frequency must be increased, and high-speed switching is required for this reason. As for losses, it is important to reduce the ON state loss as well as the switching loss. A reduction in ON state loss requires a low forward voltage drop.

In addition, a high blocking voltage of several kilovolts between main electrodes is required for the application to a high-voltage line system.

A semiconductor device, such as a static induction thyristor, gate turn-off thyristor, or the like, comprises two main electrode regions, i.e., anode and cathode regions consisting of high impurity concentration regions of opposite conductivity types, a low impurity concentration region locally formed between these two regions, and a gate region, formed near the cathode region, for controlling a main current.

In the conventional semiconductor device of this type, it is known that when the thickness of the lower-impurity concentration region is increased, a high blocking voltage between the main electrodes can be realized. In the semiconductor device, in order to realize high-speed switching, a method for uniformly reducing the carrier lifetime on the entire volume of the lower-impurity concentration region by diffusion of gold is proposed. With this method, however, if the carrier lifetime is shortened enough to realize high-speed switching, a forward voltage drop is significantly increased, and high-speed switching and a low forward voltage drop cannot be realized at the same time.

In order to solve the above problem and realize high-speed switching and low forward voltage drop at the same time, a structure wherein a region having a relatively low carrier lifetime is provided in the low impurity concentration region locally with respect to the main current direction in a static induction thyristor has been proposed.

With this structure, however, only one region having a relatively low carrier lifetime is provided. Therefore, if the low impurity concentration region is formed thick in order to realize a high blocking voltage between the main electrodes, sufficiently high-speed switching and sufficiently low forward voltage drop cannot be realized at the same time.

SUMMARY OF THE INVENTION

It is an object of the present invention to solve the above-mentioned problem of the conventional semiconductor device which comprises two main electrode regions, i.e., anode and cathode regions consisting of high impurity concentration regions of opposite conductivity types, a low impurity concentration region locally formed between the two main electrode regions, and a gate region, formed near the cathode region, for controlling a main current.

It is therefore an object of the present invention to provide a structure which can simultaneously satisfy three conditions, i.e., high-speed switching, low forward voltage drop, and high blocking voltage between main electrodes in a semiconductor device.

In order to achieve the above object of the present invention, there is provided a semiconductor device which comprises two main electrode regions, i.e., cathode and anode regions consisting of high impurity concentration regions of opposite conductivity types, a low impurity concentration region locally formed between the two main electrode regions, and a gate region, formed near the cathode region, for controlling a main current, wherein local regions having a relatively low carrier lifetime are provided in a region of the low impurity concentration region, near at least one of the gate and cathode regions and in a region thereof which is depleted at the end of the main current turn-off process or which will not be depleted to the end, thus satisfying three conditions, i.e., high-speed switching, low forward voltage drop, and high blocking voltage between the main electrodes at the same time.

The present invention can be applied to a surface gate type static induction thyristor in which a mesh or stripe gate region is formed near a cathode region, a gate turn-off thyristor which has a gate region on the front surface of a cathode region, a buried type static induction thyristor in which a gate region is buried in a low impurity concentration region, an insulated gate type static induction thyristor having an insulator surrounding a gate region, or a double-gate type static induction thyristor in which another gate region is formed near an anode region in addition to the gate region near a cathode region.

According to an aspect of the present invention, a thin layer region having a relatively high impurity concentration is formed on the front surface of an anode region, and a region having a relatively low carrier lifetime is locally formed in the thin layer region. In this aspect, when the thickness of the low impurity concentration region is set to be smaller than the diffusion length of the carriers in the region, another low carrier lifetime region is omitted.

According to another aspect of the present invention, an impurity region of the same conductivity type as that of the cathode region is locally formed in the anode region, and is set at the same potential as that of the anode region. According to still another aspect, an impurity region having the same conductivity type as that of the anode region is locally formed in the cathode region and is set at the same potential as that of the cathode region.

In order to make understanding of the operation of the present invention with the above structure easier, a basic operation of a device of this type will be described with reference to a semiconductor device comprising two main electrode regions, i.e., cathode and anode regions consisting of high impurity concentration regions of opposite conductivity types, a low impurity concentration region locally formed between the two regions, and a gate region, formed near the cathode region, for controlling a main current. For the sake of simplicity, an $n^+$-type region for the cathode region and a $p^+$-type region for the anode region are assumed.

In the OFF state of the semiconductor device, since a thick depletion layer is formed in the low impurity concentration region, a maximum electric field strength in the semiconductor device is suppressed, and a high blocking voltage between main electrodes can be realized.

In the ON state, since electrons and holes are injected into the low impurity concentration region from the $n^+$-type cathode region and the $p^+$-type anode region, the resistance of the low impurity concentration region is decreased, thus realizing a low forward voltage drop. In this case, if a carrier lifetime in the low impurity concentration region is high, a carrier density in the low impurity concentration region in the ON state is increased, thus further decreasing the forward voltage drop.

A switching operation from the OFF to ON state is performed by positively biasing the gate region with respect to the $n^+$-type cathode region. When the gate region is positively biased, electrons are ejected from the $n^+$-type cathode region to the low impurity concentration region. The injected electrons reach a portion near the $p^+$-type anode region at high speed due to the electric field in the depletion layer, thus inducing injection of holes from the $p^+$-type anode region. The injected holes reach a portion near the $n^+$-type cathode region at high speed due to the electric field in the depletion layer, thus promoting electron injection from the $n^+$-type cathode region. The above operation is repeatedly performed as a positive feedback operation, so that the low impurity concentration region is filled with electrons and holes and its resistance is decreased, thus turning on the semiconductor device. Therefore, the above-mentioned turn-on process is performed at high speed.

The switching operation from the ON to OFF state is performed by negatively biasing the gate region with respect to the $n^+$-type cathode region. When the gate region is negatively biased, electron injection from the $n^+$-type cathode region is stopped, and the above-mentioned positive feedback loop is interrupted. Thereafter, the depletion layer extends into the low impurity concentration region from the portion near the gate region, as the electrons and holes in the low impurity concentration region are recombined and extinguished, thus turning off the semiconductor device. This turn-off process largely depends on the carrier lifetime in the low impurity concentration region. Since the carrier lifetime is high in order to realize the low forward voltage drop, the turn-off process is performed slowly.

The basic operation has been described with reference to the semiconductor device which does not include a characteristic structure according to the present invention. The operation of an improved semiconductor device according to the present invention will now be described. More specifically, the operation will be described wherein the present invention is applied to the above semiconductor device, and local regions having a relatively low carrier lifetime are formed near a gate or cathode region in the low impurity concentration region and in a region thereof which is depleted at the end of the main current turn-off process or a region which will not be depleted to the end.

A blocking voltage between the main electrodes mainly depends on the impurity concentration of the low impurity concentration region. When the local regions as the main feature of the present invention are provided, the impurity concentration of the low impurity concentration region is no longer changed. Therefore, the blocking voltage is high as well as in the case wherein no local region is formed.

A forward voltage drop mainly depends on a carrier density distribution in the low impurity concentration region in the ON state. When the local regions of the present invention are provided, since the carrier density distribution is only locally influenced, an increase in forward voltage drop is small.

A switching operation from the OFF to ON state does not depend on a recombination amount if an injection amount of carriers into the low impurity concentration region is very large as compared to the recombination amount. Therefore, even if the local regions of the present invention are provided, the turn-on process is performed at high speed.

A switching operation from the ON to OFF state main depends on the carrier lifetime in the low impurity concentration region, and can be performed at very high speed by the structure of the present invention. The reason for this will be explained below in detail.

The local region having a relatively low carrier lifetime formed near the gate region assists to decrease the hole density in the front surface of an $n^+$-type cathode region, thereby stopping electron injection from the $n^+$-type cathode region. In addition, when the carrier density in the low impurity concentration region is decreased, the first half of the turn-off process can be advantageously performed at high speed. However, during the turn-off process, when the local region in the low impurity concentration region near the gate region has been depleted, it is no longer effective for extinguishment of carriers, and does not contribute to high-speed turn-off process. The local region having the relatively low carrier lifetime formed in the region which is depleted at the end of the main current turn-off process or in the region which will not be depleted to the end causes recombination or extinguishment of carriers in the low impurity concentration region during the first half of the main current turn-off process. However, as can be understood from the above definition, this local region is more effective during the second half of the turn-off process. Therefore, the local region is effective mainly for shortening the second half of the turn-off process. More specifically, when the two local regions having the relatively low carrier lifetime of the present invention are provided, high-speed main current turn-off process can be achieved. If either one of these local regions is omitted, only the first or second half of the turn-off process is shortened, and a entirely short turn-off process as a whole cannot be expected.

According to the present invention as described above, when local regions having a relatively low carrier lifetime are formed in a region near the cathode region and in a region which is depleted at the end of the main current turn-off process or a region which will not be depleted to the end, in a low impurity concentration region for obtaining a blocking voltage between main electrodes, a high blocking voltage, a low forward voltage drop, and high-speed switching can be realized.

DESCRIPTION OF THE PREFERRED EMBODIMENTS

First Embodiment

A first embodiment in which the present invention is applied to a surface gate type n-channel static induction thyristor will be described hereinafter. In the case of an n-channel type, the thyristor basically has a structure wherein a p+-type mesh or stripe gate region is formed near an n+-type region serving as the cathode of a p+n−n+ or p+nn−n+ diode.

Figure 1:
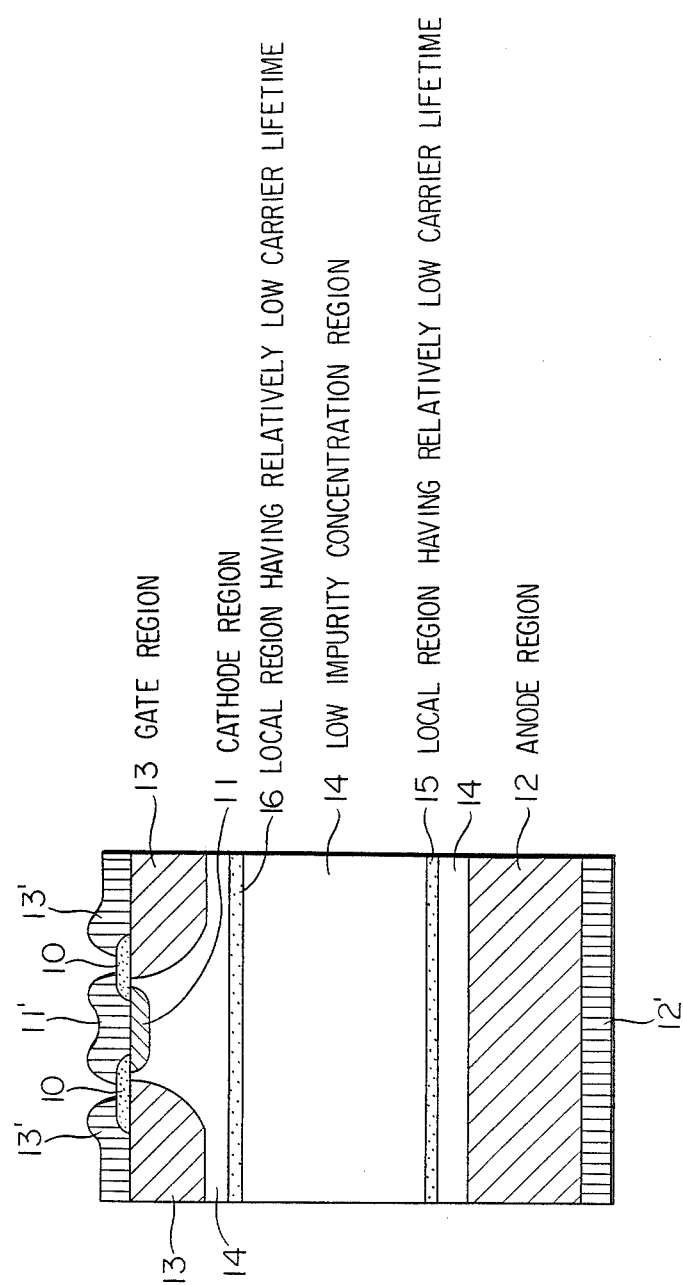
FIG. 1 is a sectional view showing a first embodiment in which the present invention is applied to a surface gate type static induction thyristor.

FIG. 1 shows one unit of a sectional structure of a static induction thyristor according to the first embodiment.

Boron is diffused in the entire one surface of an n-type silicon substrate having an impurity concentration of about $1 \times 10^{14}$ cm$^{-3}$ and a thickness of about 250 μm from its one surface to form a p+-type anode region 12 having a diffusion depth of 10 m. Boron and arsenic are selectively diffused in the silicon substrate from its other surface to form a p+-type gate region 13 having a diffusion depth of 4 μm and an n+-type cathode region 11 having a diffusion depth of 0.5 μm, respectively. Thereafter, 5-μm thick aluminum electrodes 11', 12', and 13' respectively connected to the cathode, anode, and gate regions 11, 12, and 13 are formed on the resultant structure. Reference numeral 10 denotes an insulating film. Finally, a proton beam having an energy of 1.1 MeV is radiated at a dose of about $1 \times 10^{12}$ protons/cm$^2$ from the both surfaces of the resultant element to form regions 15 and 16, thus preparing the static induction thyristor having the structure of the present invention as shown in FIG. 1. The proton beam having the energy of 1.1 MeV is transmitted through the element surface to a depth of about 20 μm. A crystal lattice is damaged due to proton beam irradiation more seriously in a region near the projection depth of the proton beam than a region belonging to the transmission path of the proton beam. Therefore, in this embodiment, the regions 15 and 16 having the short carrier lifetime are locally present near a portion having a depth of about 20 m from the element surface.

A blocking voltage between main electrodes is about 1 kV in both the forward and reverse directions, and does not depend on the presence/absence of the regions 15 and 16.

When an anode current $I_A$ (main current) is 50 A, the forward voltage drop of a static induction thyristor having neither the region 15 nor 16 is 1.3 V and that of the thyristor of this embodiment having both the regions 15 and 16 is 2.95 V. Therefore, even if the structure of the present invention is employed, the forward voltage drop is increased at most to twice the conventional value.

In order to examine switching characteristics of the first embodiment, a positive pulse voltage was applied to the gate at a desired turn-on timing and a negative voltage pulse was applied thereto at a desired turn-off timing, thus measuring switching waveforms of various static induction thyristors. Note that a voltage applied to the anode was 100 V.

Figure 2:
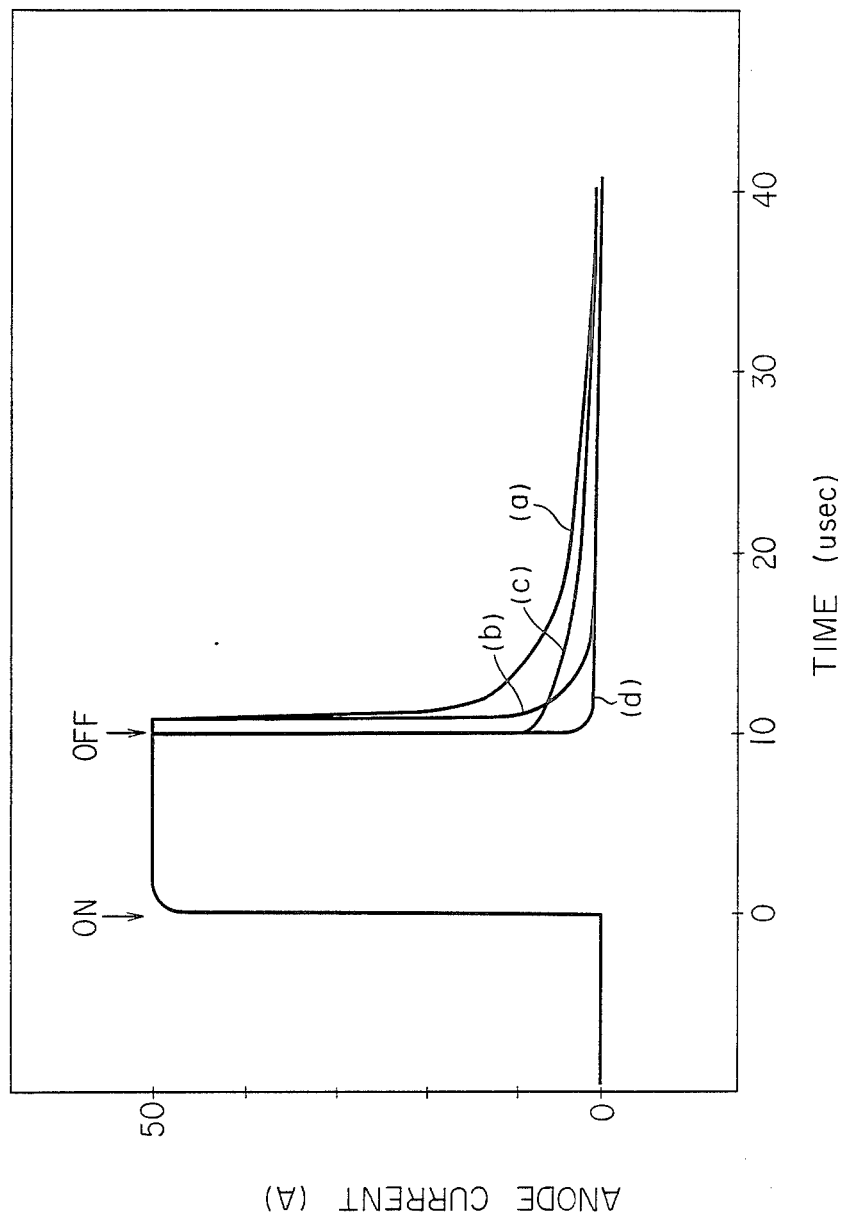
FIG. 2 is a graph showing a switching waveform of the first embodiment and conventional switching waveforms.

FIG. 2 shows the measurement results, i.e., a waveform (a) of a static induction thyristor having neither the region 15 nor 16 having the relatively low carrier lifetime, a waveform (b) of a thyristor having only the region 15, a waveform (c) of a thyristor having only the region 16, and a waveform (d) of the thyristor of the present invention having both the regions 15 and 16.

As can be seen from FIG. 2, the turn-on times (a time required for the turn-on process from when an ON signal is applied to the gate until the anode current $I_A$ reaches 90%) of the above four static induction thyristors were equal, i.e., about 0.2 μsec. A turn-off time (a time required for a turn-off process; a total of a storage time $t_{stg}$ and a fall time $t_f$) is noticeably influenced by the presence/absence of the local regions 15 and 16. Note that the storage time $t_{stg}$ is a time from when an OFF signal is applied to the gate until the anode current $I_A$ is decreased to 90%, and the fall time $t_f$ is a time required for decreasing the anode current $I_A$ from 90% to 10%.

In the static induction thyristor having neither the local regions 15 and 16 having the relatively low carrier lifetime, the storage time $t_{stg}$ is relatively short, i.e., 0.85 μsec, and the fall time $t_f$ is not so short, i.e., 6 μsec.

In contrast to this, in the static induction thyristor having only the local region 15, the storage time $t_{stg}$ is not so improved, i.e., 0.7 μsec, but the fall time $t_f$ is relatively short, i.e., 1.35 μsec.

In the static induction thyristor having only the local region 16, the storage time $t_{stg}$ is short, i.e., 0.2 μsec but the fall time $t_f$ is not so short, i.e., 4.7 μsec.

In the static induction thyristor having both the regions 15 and 16 according to the present invention, the storage time $t_{stg}$ is short, i.e., 0.17 μsec, and the fall time $t_f$ is very short, i.e., 0.05 μsec. That is, when the structure of the present invention is employed, a switching time (a total of the turn-on and turn-off times) becomes very short, i.e., about 7 μsec to about 0.4 μsec. In other words, the switching speed of the static induction thyristor employing the present invention is about 18 times that of the thyristor without employing the present invention.

The above results are shown in the table below.

| Local regions | | Blocking voltage between main electrodes (V) | Forward voltage drop (V) | Switching time | | |
|---|---|---|---|---|---|---|
| | | | | Turn-on time (μsec) | Turn-off time | |
| Region 15 | Region 16 | | | | Storage time $t_{stg}$ (μsec) | Storage time $t_f$ (μsec) |
| absent | absent | 1,000 | 1.3 | 0.2 | 0.85 | 6.0 |
| present | absent | | 1.55 | 0.2 | 0.7 | 1.35 |
| absent | present | | 1.7 | 0.2 | 0.2 | 4.7 |
| present | present | | 2.95 | 0.2 | 0.17 | 0.05 |

To summarize, according to the embodiment of the present invention, a high forward/reverse blocking voltage of about 1 kV, a low forward voltage drop of about 3 V, and high-speed switching of at about 0.4 sec can be realized at the same time. Note that the formation method of the regions 15 and 16 is not limited to proton beam irradiation, but can be a local carrier lifetime reduction method. A semiconductor is not limited to silicon, but can be germanium, gallium-arsenide, and the like. A structure wherein all the p- and n-type regions are replaced with each other can be employed. Wiring layers are not limited to aluminum wiring layers, but can be other metal wiring layers (Ti, W) or metal silicide wiring layers.

The first embodiment in which the present invention is applied to the static induction thyristor has been described. The same effect can be expected from other semiconductor devices having the same basic operation mechanism. Several embodiments will be described hereinafter.

Second Embodiment

Figure 3:
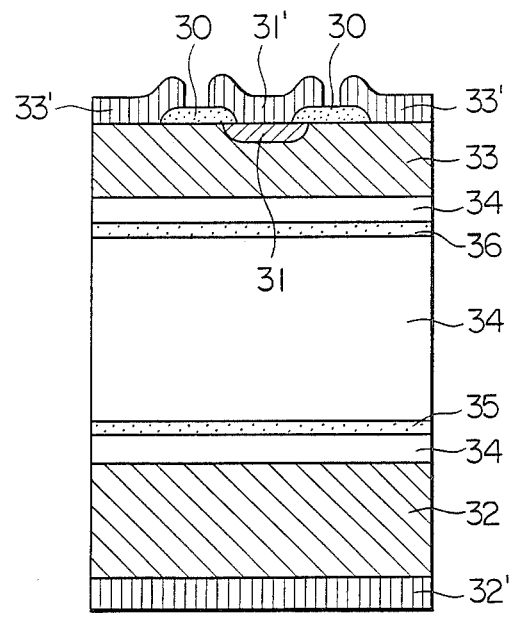
FIG. 3 is a sectional view showing a second embodiment in which the present invention is applied to a gate turn-off thyristor.

FIG. 3 shows a second embodiment in which the present invention is applied to a gate turn-off thyristor.

The thyristor of this embodiment comprises a cathode region 31 consisting of a high impurity concentration region, an anode region 32 consisting of a high impurity concentration region of an opposite conductivity type to the cathode region 31, a gate region 33, formed near the cathode region 31, for controlling a main current, a local region 36 having a relatively low carrier lifetime formed near the gate region in a low impurity concentration region 34 between the cathode and anode regions 31 and 32, and a local region 35 having a relatively low carrier lifetime formed in a region, which is depleted at the end of a main current turn-off process or in a region which will not be depleted to the end, in the low impurity concentration region 34 between the cathode and anode regions 31 and 32. The basic structure of the thyristor of this embodiment is the same as that of the first embodiment. Note that reference numeral 30 denotes an insulating film; and 31', 32', and 33', metal or metal silicide wiring layers respectively connected to the cathode, anode, and gate regions 31, 32, and 33.

In the second embodiment, however, since the present invention is applied to the gate turn-off thyristor and has the gate region 33 in the front surface of the cathode region 31, micropatterning need not be as fine as that for the static induction thyristor in order to realize a high blocking voltage. Therefore, a device with a large area, i.e., a large current, can be achieved. However, with the above structure, if the impurity concentration of the gate region 33 is increased in order to decrease a gate resistance, the forward voltage drop increases unlike the case of the static induction thyristor. Therefore, the switching speed of the thyristor of this embodiment is lower than that of the static induction thyristor. Other basic operations are the same as those of the first embodiment, and the same effect as described above can be obtained.

Third Embodiment

Figure 4:
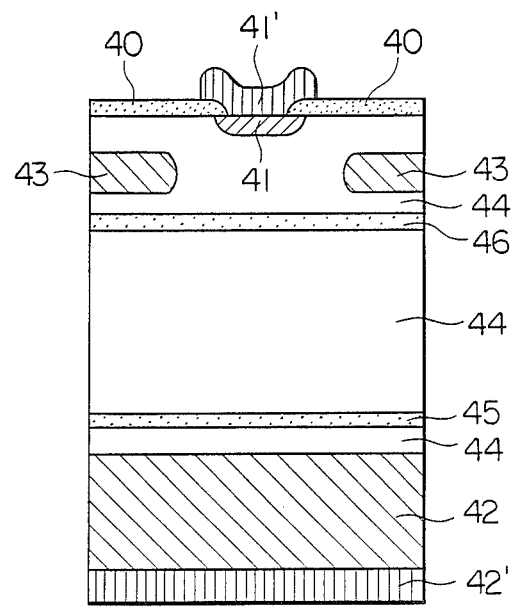
FIG. 4 is a sectional view showing a third embodiment in which the present invention is applied to a buried gate type thyristor.

FIG. 4 shows a third embodiment in which the present invention is applied to a buried gate type thyristor.

The thyristor of the third embodiment comprises a cathode region 41 consisting of a high impurity concentration region, an anode region 42 consisting of a high impurity concentration region of an opposite conductivity type to that of the cathode region 41, a gate region 43, formed adjacent to the cathode region 41, for controlling a main current, a local region 46 formed near the gate region in a low impurity concentration region 44 between the cathode and anode regions 41 and 42 and having a relatively low carrier lifetime, and a local region 45 having a relatively low carrier lifetime and formed in a region, which is depleted at the end of a main current turn-off process or in a region which will not be depleted to the end, in the low impurity concentration region 44 between the cathode and anode regions 41 and 42. The basic structure of the third embodiment is the same as that of the first embodiment. Note that reference numeral 40 denotes an insulating film; and 41' and 42', metal or metal silicide wiring layers respectively connected to the cathode and anode regions 41 and 42.

However, in this embodiment, the present invention is applied to the buried gate type static induction thyristor. Unlike the surface gate type static induction thyristor of the first embodiment, the gate region 43 is buried in the low impurity concentration region 44 as its name "buried gate type" implies.

The third embodiment can realize a high breakdown voltage between the gate and cathode as compared to the surface gate type thyristor of the first embodiment. Therefore, a high blocking voltage between main electrodes can be easily realized. In addition, a small power supply capacitor for driving the gate can be advantageously adopted.

If a distance between the gate and cathode is prolonged taking the breakdown voltage between the gate and cathode in consideration, carriers present therebetween cannot be effectively extinguished. In this case, a local region having a relatively low carrier lifetime can be formed between the gate and cathode.

Fourth Embodiment

Figure 5:
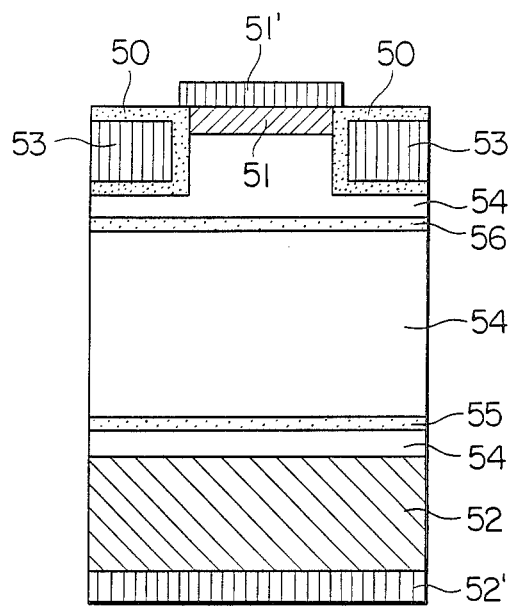
FIG. 5 is a sectional view showing a fourth embodiment in which the present invention is applied to an insulated gate type static induction thyristor.

FIG. 5 shows a fourth embodiment in which the present invention is applied to an insulated gate type thyristor.

The thyristor of the fourth embodiment comprises a cathode region 51 consisting of a high impurity concentration region, an anode region 52 consisting of a high impurity concentration region of an opposite conductivity type to that of the cathode region 51, a gate region 53, formed adjacent to the cathode region 51, for controlling a main current, a local region 56 formed near the gate region in a low impurity concentration region 54 between the cathode and anode regions 51 and 52 and having a relatively low carrier lifetime, and a local region 55 having a relatively low carrier lifetime and formed in a region, which is depleted at the end of a main current turn-off process or in a region which will not be depleted to the end, in the low impurity concentration region 54 between the cathode and anode regions 51 and 52. The basic structure including the local regions 55 and 56 having the relatively low carrier lifetime is the same as that of the first embodiment. In addition, the basic operation and the effect are the same as those of the first embodiment.

However, in the fourth embodiment, the present invention is applied to the insulated gate type static induction thyristor, which is not of a normal junction type as its name "insulated gate type" implies. Unlike the junction type surface gate type static induction thyristor of the first embodiment, the thyristor of the fourth embodiment has a structure in which the gate region 53 is isolated by an insulating film 50. Note that reference numerals 51' and 52' denote metal or metal silicide electrode wiring layers.

The static induction thyristor of the fourth embodiment has a high input impedance unlike the junction type static induction thyristor of the first embodiment having a low input impedance. Therefore, a drive circuit for the gate can be simplified.

Note that the thyristor of the fourth embodiment is of the surface gate type, but can be formed as the buried gate type as in the third embodiment.

Fifth Embodiment

Figure 6:
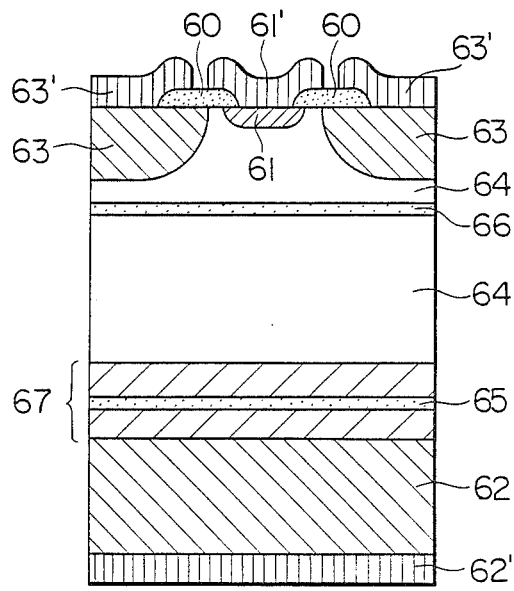
FIG. 6 is a sectional view showing a fifth embodiment having a structure wherein a thin layer region having a relatively high impurity concentration is formed in a front surface of an anode region in the thyristor of the first embodiment of the present invention.

FIG. 6 shows a fifth embodiment having a structure in which a thin layer region 67 having a relatively high impurity concentration is provided on the front surface of the anode region in the structure of the first embodiment.

More specifically, the thyristor of the fifth embodiment comprises a cathode region 61 consisting of a high impurity concentration region, an anode region 62 consisting of a high impurity concentration region of an opposite conductivity type to that of the cathode region 61, a gate region 63, formed adjacent to the cathode region 61, for controlling a main current, a local region 66 formed near the gate region in a low impurity concentration region 64 between the cathode and anode regions 61 and 62 and having a relatively low carrier lifetime, and a local region 65 having a relatively low carrier lifetime and formed in a region, which is depleted at the end of a main current turn-off process or in a region which will not be depleted to the end, in the thin layer region 67 having a relatively high impurity concentration. This basic structure is the same as that of the first embodiment. The basic operation and effect thereof are the same as those of the first embodiment.

The main feature of this embodiment different from the first embodiment is that the thin layer region 67 having the relatively high impurity concentration is provided on the front surface of the anode region 62, and the local region 65 is arranged therein. With this structure, an electric field distribution between the gate and anode regions 61 and 62 exhibits a rectangular shape due to a maximum blocking voltage applied to the anode region 62 in the main current OFF state, and the thin layer region 67 having the relatively high impurity concentration remains as a region which will not be depleted to the end.

Therefore, the static induction thyristor of the fifth embodiment can realize a higher blocking voltage than that of the thyristor of the first embodiment by means of the low impurity concentration region having the same thickness.

The structure of the fifth embodiment including the thin layer region 67 can be applied to the second, third, and fourth embodiments.

Sixth Embodiment

Figure 7:
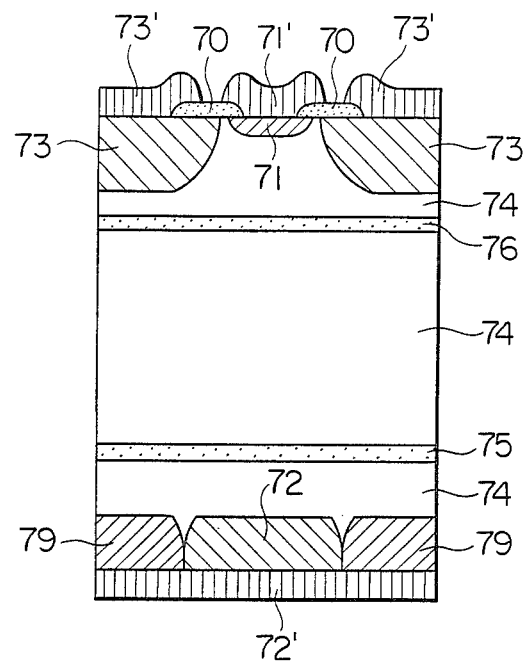
FIG. 7 is a sectional view showing a sixth embodiment in which an impurity concentration region of the same conductivity type as that of a cathode region is locally formed in an anode region to have the same potential as that of the anode region in the thyristor of the first embodiment of the present invention.

FIG. 7 shows a sixth embodiment having a structure wherein a region 79 having the same conductivity type as that of a cathode region is locally formed in an anode region to have the same potential as that of the anode region, in the structure of the first embodiment.

More specifically, the thyristor of the sixth embodiment comprises a cathode region 71 consisting of a high impurity concentration region, an anode region 72 consisting of a high impurity concentration region of an opposite conductivity type to that of the cathode region 71, a gate region 73, formed adjacent to the cathode region 71, for controlling a main current, a local region 76 having a relatively low carrier lifetime and formed adjacent to the gate region 73 in a low impurity concentration region 74 between the cathode and anode regions 71 and 72, and a local region 75 having a relatively low carrier lifetime and formed in a region, which is depleted at the end of a main current turn-off process or in a region which will not be depleted to the end, in the low impurity concentration region 74 between the cathode and anode regions 71 and 72. Note that reference numeral 70 denotes an insulating film; and 71', 72', and 73', metal or metal silicide electrode wiring layers. The basic structure of this embodiment is the same as that of the first embodiment. In addition, the basic operation and effect thereof are the same as those of the first embodiment.

The main feature of this embodiment different from that of the first embodiment is that the region 79 having the same conductivity type as that of the cathode region is locally formed in the anode region 72 and is used to have the same potential as that of the anode region 72. With this structure, since the region 79 has the same conductivity type as that of the cathode region 71, carriers injected from the cathode region 71 into the low impurity concentration region 74 can be easily wiped out, thus shortening the turn-off time.

Note that the structure of the sixth embodiment wherein the impurity region 79 having the same conductivity type as that of the cathode region 71 is locally formed in the anode region 72 can be applied to the second, third, fourth, and fifth embodiments.

Seventh Embodiment

Figure 8:
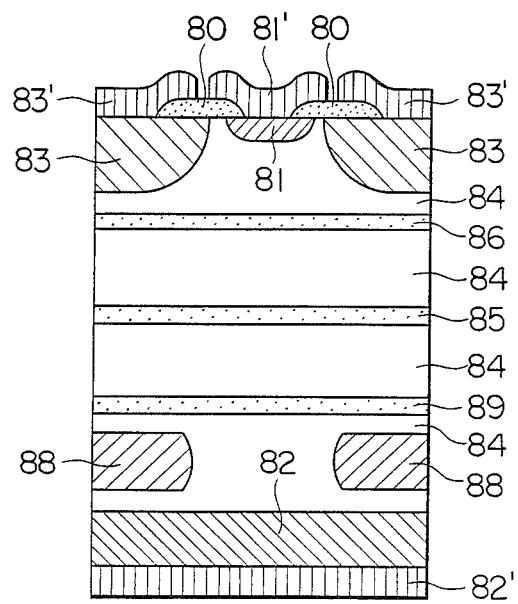
FIG. 8 is a sectional view showing a seventh embodiment in which the present invention is applied to a double gate type static induction thyristor.

FIG. 8 shows a seventh embodiment in which the present invention is applied to a double-gate type static induction thyristor.

The main feature of this double-gate type static induction thyristor is that a gate for controlling a main current is provided adjacent to both cathode and anode regions.

More specifically, the thyristor of the seventh embodiment comprises a cathode region 81 consisting of a high impurity concentration region, an anode region 82 consisting of a high impurity concentration region of an opposite conductivity type to that of the cathode region 81, a first gate region 83, formed adjacent to the cathode region 81, for controlling the main current, a second gate region 88, formed adjacent to the anode region 82, for controlling the main current, first and third local regions 86 and 89 having a relatively low carrier lifetime and formed respectively adjacent to the first and second gate regions 83 and 88 in a low impurity concentration region 84 between the cathode and anode regions 81 and 82, and a second local region 85 having a relatively low carrier lifetime and formed, at a region which is depleted at the end of the main current turn-off process or a region which will not be depleted to the end, to be located near the central portion between the cathode and anode regions 81 and 82. Note that reference numeral 80 denotes an insulating film; and 81', 82', and 83', metal or metal silicide electrode wiring layers. The main feature of the structure of the seventh embodiment is that the second gate region 88 and the third local region 89 are added to the structure of the first embodiment. However, the basic operation and effect of this embodiment are the same as in the first embodiment.

In the seventh embodiment, the first gate region 83 near the cathode region 81 controls carrier injection from the cathode region 81, and the second gate region 88 near the anode region 82 controls carrier injection from the anode region 82. Therefore, higher switching speed can be realized than that of the static induction thyristor of the first embodiment which controls only carrier injection from the cathode region 81.

The gate structure of the double-gate type static induction thyristor of this embodiment can be desirably combined with the surface gate type, buried gate type, junction gate type, or insulated gate type thyristor of the above embodiments.

In the above embodiments, a distance (or distances) between two or three local regions having a relatively low carrier lifetime falls within a diffusion length of carriers in the low impurity concentration region. However, when the distance (or distances) between the two or three local regions exceeds the diffusion length, a carrier recombination effect is degraded. Therefore, it is preferable that at least one local region having a relatively low carrier lifetime is added between the two or three local regions.

For the same reason as above, it is also effective that if the distance between the gate and cathode regions exceeds the diffusion length of carriers in the low impurity concentration region, a local region having a relatively low carrier lifetime is added near the cathode region in the low impurity concentration region.

Eighth Embodiment

Figure 9:
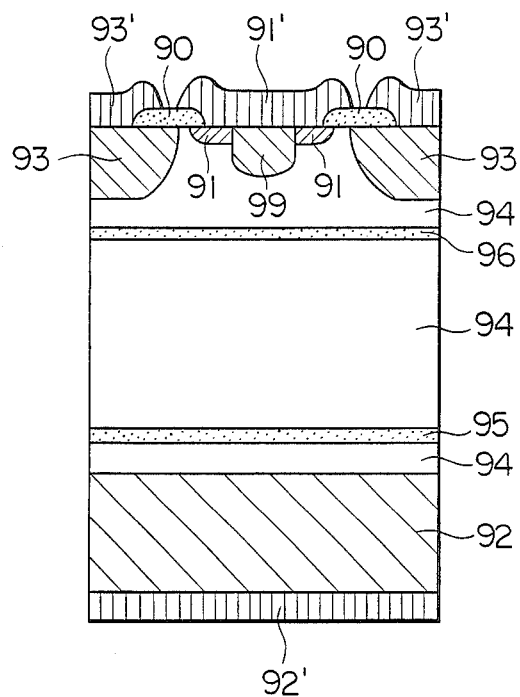
FIG. 9 is a sectional view showing an eighth embodiment having a structure wherein an impurity region of the same conductivity type as that of an anode region is locally formed in a cathode region to have the same potential as that of the cathode region in the thyristor of the first embodiment.

FIG. 9 shows an eighth embodiment having a structure in which a region 99 of the same conductivity type as that of an anode region is locally formed in a cathode region to have the same potential as that of the cathode region, in the structure of the first embodiment.

More specifically, the thyristor of the eighth embodiment comprises a cathode region 91 consisting of a high impurity concentration region, an anode region 92 consisting of a high impurity concentration region of an opposite conductivity type to that of the cathode region 91, a gate region 93, formed near the cathode region 91, for controlling a main current, a local region 96 having a relatively low carrier lifetime and formed near the gate region 93 in a low impurity concentration region 94 between the cathode and anode regions 91 and 92, and a local region 95 having a relatively low carrier lifetime and formed in a region, which is depleted at the end of a main current turn-off process or in a region which will not be depleted to the end, in the low impurity concentration region 94 between the cathode and anode regions 91 and 92. Note that reference numeral 90 denotes an insulating film; and 91', 92', and 93', metal or metal silicide electrode wiring layers. The basic structure of this embodiment is the same as that of the first embodiment. In addition, the basic operation and effect are the same as those in the first embodiment.

The main feature of this embodiment different from the first embodiment is that the impurity region 99 having the same conductivity type as that of the anode region is locally formed in the cathode region 91 and is used to have the same potential as that of the cathode region 91. With this structure, since the region 99 is of the same conductivity type as that of the anode region 92, carriers injected from the anode region 92 into the low impurity concentration region 94 can be easily wiped out, thus shortening the turn-off time.

The structure of the eighth embodiment in which the impurity region 99 of the same conductivity type as that of the anode region 92 is locally formed in the cathode region 91 can be applied to the second, third, fourth, fifth, and sixth embodiments.

According to the present invention as described above, since local regions having a relatively low carrier lifetime are provided, in a semiconductor device which exhibits excellent characteristics, i.e., a high blocking voltage between main electrodes, a low forward voltage drop, and high-speed switching, can be realized.

Therefore, according to the present invention, since a control frequency can be increased over an audible frequency range, noise generated by the device can be noticeably reduced.

Since a switching loss is small even at high frequencies, heat dissipation arrangement can be simplified, and the system can be compact and lightweight.

What is claimed is:

1. A static induction thyristor comprising:
   a cathode region consisting of a high impurity concentration region;
   an anode region consisting of a high impurity concentration region of an opposite conductivity type than that of said cathode region;
   said anode and cathode regions being spaced from one another;
   a low impurity concentration region locally formed between said cathode and anode regions;
   a gate region, formed near said cathode region, for controlling flow of a main current;
   a first local region having a relatively low carrier lifetime and formed in said low impurity concentration region near at least one of said gate and cathode regions, said first local region being formed as a layer extending substantially perpendicular to the flow of the main current; and
   a second local region having a relatively low carrier lifetime and formed in a region of said low impurity concentration region near said anode region, said second local region being formed as a layer extending substantially perpendicular to the flow of the main current.

2. A static induction thyristor according to claim 1, comprising a region of the same conductivity type as that of said cathode region locally formed in said anode region and at the same potential as that of said anode region.

3. A static induction thyristor according to claim 1, comprising a third local region formed between said first and second local regions so that the distance between said local regions of relativley low carrier lifetime does not exceed the distance of diffusion in said low impurity concentration region of carriers injected by said cathode region.

4. A static induction thyristor according to claim 3, comprising a second gate region formed near said anode region for controlling the flow of current.

5. A static induction thyristor according to claim 3, comprising a region of the same conductivity type as that of said cathode region locally formed in said anode region and at the same potential as that of said anode region.

6. A static induction thyristor comprising:
    a cathode region consisting of a high impurity concentration region;
    an anode region consisting of a high impurity concentration region of an opposite conductivity type to that of said cathode region, said anode region having a front surface facing said cathode region;
    a thin layer region formed on said front surface of said anode region and having a relatively impurity concentration;
    a low impurity concentration region locally formed between said cathode region and said thin layer region;
    a gate region, formed near said cathode region, for controlling flow of a main current;
    a first local region having a relatively low carrier lifetime and formed in said low impurity concentration region near at least one of said gate and cathode regions, said first local region being formed as a layer extending substantially perpendicular to the flow of the main current; and
    a second local region having a relatively low carrier lifetime and formed in said thin layer region, said second local region being formed as a layer extending substantially perpendicular to the flow of the main current.

7. A static induction thyristor according to claim 6, comprising a third local region formed between said first and second local regions so that the distance between said local regions of relatively low carrier lifetime does not exceed the distance of diffusion in said low impurity concentration region of carriers injected by said cathode region.

8. A static induction thyristor according to claim 7, comprising a region of the same conductivity type as that of said cathode region locally formed in said anode region and at the same potential as that of said anode region.

9. A static induction thyristor according to claim 7, comprising a second gate region formed near said anode region for controlling the flow of main current.

10. A static induction thyristor according to claim 6, comprising a region of the same conductivity type as that of said cathode region locally formed in said anode region and at the same potential as that of said anode region.

11. A static induction thyristor according to claim 6, comprising a second gate region formed near said anode region for controlling the flow of main current.

* * * * *

UNITED STATES PATENT AND TRADEMARK OFFICE
CERTIFICATE OF CORRECTION

PATENT NO. : 4,752,818
DATED : June 21. 1988
INVENTOR(S) : Kushida et al.

It is certified that error appears in the above—identified patent and that said Letters Patent is hereby corrected as shown below:

Column 13,

Claim 6; Line 9: After "relatively" add --high--

Signed and Sealed this

Eleventh Day of April, 1989

Attest:

DONALD J. QUIGG

Attesting Officer

Commissioner of Patents and Trademarks